(12) United States Patent
Mizouchi (10) Patent No.: US 6,614,597 B2
(45) Date of Patent: Sep. 2, 2003

(54) ILLUMINATION APPARATUS AND PROJECTION EXPOSURE APPARATUS

(75) Inventor: Satoru Mizouchi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/920,076

(22) Filed: Aug. 1, 2001

(65) Prior Publication Data

US 2002/0067550 A1 Jun. 6, 2002

(30) Foreign Application Priority Data

Aug. 3, 2000 (JP) ........................ 2000/235626

(51) Int. Cl.[7] ................................................ G02B 3/00
(52) U.S. Cl. ........................ 359/649; 359/619
(58) Field of Search .................. 359/619, 618, 359/333, 468, 349, 649–651, 754; 362/268, 277, 296, 341

(56) References Cited

U.S. PATENT DOCUMENTS

| 5,684,567 A | * | 11/1997 | Shiozawa | 355/67 |
|---|---|---|---|---|
| 5,739,899 A | | 4/1998 | Nishi et al. | 355/53 |
| 6,078,380 A | * | 6/2000 | Taniguchi et al. | 355/52 |
| 6,285,442 B1 | * | 9/2001 | Sato | 355/67 |
| 6,392,740 B1 | * | 5/2002 | Shiraishi et al. | 355/53 |
| 6,452,661 B1 | * | 9/2002 | Komatsuda | 355/67 |

FOREIGN PATENT DOCUMENTS

| EP | 0867772 | 9/1998 | G03F/7/20 |
|---|---|---|---|
| JP | 9-26554 | 1/1997 | G02B/27/18 |
| JP | 10-270312 | 10/1998 | H01L/21/027 |
| JP | 11-87232 | 3/1999 | H01L/21/027 |

* cited by examiner

*Primary Examiner*—Jordan M. Schwartz
*Assistant Examiner*—Jessica Stultz
(74) *Attorney, Agent, or Firm*—Morgan & Finnegan, LLP (57) ABSTRACT

An illumination apparatus that can adjust telecentricity of beams on a wafer without reducing the use efficiency of light is provided. The illumination apparatus moves an inner surface reflection type optical integrator in a direction orthogonal to an optical axis, and thus shifts light intensity distribution on a light emission surface thereof, thereby shifting the baricenter of the light intensity distribution on a light incident surface of multi-beam generation means. Therefore, the telecentricity of image-forming beams on the axis may be adjusted.

22 Claims, 9 Drawing Sheets

ILLUMINATION APPARATUS AND PROJECTION EXPOSURE APPARATUS

BACKGROUND OF THE INVENTION

This invention relates to an illumination apparatus, a projection exposure apparatus including the illumination apparatus, and a device fabricating method using the exposure apparatus, and more particularly to an illumination apparatus suitably applicable to a projection exposure apparatus used in the lithography process upon fabrication of devices such as semiconductor devices.

Recently, a projection exposure apparatus for fabricating a very large-scale integrated circuit (VLSI) or other semiconductor devices that achieve large packaging densities requires uniform illuminance distribution and high telecentricity of beams incident upon a wafer (or substrate) during circuit patterning process.

In general, a semiconductor device is fabricated through a plurality of rounds of the lithography process. Therefore, if the telecentricity of beams incident upon a wafer decreased, an image would shift when a different circuit pattern is overlaid and exposed on the same surface of the wafer on which steps were formed during the previous round of the lithography process, which would disadvantageously make it impossible to obtain a high precision semiconductor device. The decrease of the telecentricity of beams incident upon a wafer would be derived, for example, from a geometrical optical shift due to errors during manufacture of the projection system, a shift of light quantity baricenter due to nonuniform transmittance of dielectric multilayer film in an optical device of the projection system, a geometrical optical shift due to errors during manufacture of the illumination system or errors during movement of a movable part when a change is made in value 6 represented by a ratio of the number of apertures in the projection system to the number of apertures in the illumination system or when a change is made in illumination methods between normal illumination and slanting illumination, a shift of light quantity baricenter due to nonuniform transmittance of dielectric multi-layer film in an optical device of the illumination system, or the like. It goes without saying that the above factors would not only take place singly, but also conspire to take place simultaneously.

In order to correct the telecentricity on an illuminated surface, for example, a projection exposure apparatus (projection aligner) as disclosed in Japanese Laid-Open Patent Application, Publication No. 9-26554 corresponding to U.S. Pat. No. 5,739,899 has two-stage fly-eye lenses as amplitude division type integrators disposed in series in an optical path of the illumination system, and a light emitted through the first fly-eye lens is Kohler-illuminated into a light incident surface of the second fly-eye lens, where the second fly-eye lens is comprised of two groups, the second group is moved in a plane orthogonal to an optical axis with respect to the first group, so that a direction of beams emitted through the second fly-eye lens is changed to adjust the telecentricity of the beams on an image plane.

In a technique mentioned as a prior art in the above reference, a part of the optical system posterior to the fly-eye lenses is moved in a direction orthogonal to an optical axis or in a direction parallel to the optical axis to adjust the telecentricity on the image plane in the projection system.

However, according to the adjusting methods disclosed in the above reference, the direction of beams emitted from the second fly-eye lens may change as the second group of the second fly-eye lens shifts, but in that event, the Kohler illumination of the illuminated plane using the second fly-eye lens would transversely shift an area illuminated by the illumination light. Accordingly, in order to make substantial adjustment of telecentricity feasible, a larger area than an indispensable illumination area is required illuminating by illumination light, and use efficiency of the illumination light would result. These circumstances would consequently lead to loss of throughput.

In the technique mentioned as a prior art in the above reference as well, the illumination light should disadvantageously illuminate a larger area than indispensable illumination area for fabricating semiconductor devices.

SUMMARY OF THE INVENTION

Accordingly, it is an exemplified general object of the present invention to provide an illumination apparatus that can adjust telecentricity on an image plane without reducing use efficiency of illumination light.

According to an aspect of the present invention, there is provided an illumination apparatus comprising: a first optical system for forming uniform light intensity distribution; a second optical system including an optical integrator and a condensing system for superposing a plurality of beams from the optical integrator on a surface to be illuminated; a projection system for projecting the uniform light intensity distribution onto the optical integrator of the second optical system; and a device for moving the uniform light intensity distribution in a direction across an optical axis of the projection system.

According to another aspect of the present invention, there is provided an illumination apparatus comprising: a first optical integrator of an inner surface reflection type; a first condensing system for condensing light from a light source into a light incident part of the first optical integrator; a second optical integrator of an amplitude division type; a second condensing system for superposing a plurality of beams from the second optical integrator on a surface to be illuminated; an image-forming system for forming an image of a light emission part of the inner surface reflection type optical integrator on the amplitude division type optical integrator; and a device for moving the light emission part of the inner surface reflection type optical integrator in a direction across an optical axis of the second condensing system. The device may move the light emission part in a direction orthogonal to the optical axis. The device may further move the first optical integrator in the orthogonal direction within such a range that creates no a loss of light incident onto the first optical integrator. Moreover, at least part of optical elements in the first condensing system may be moved in the direction orthogonal to the optical axis in synchronization with movement of the first optical integrator. Alternatively, the device pivots the first optical integrator about an axis orthogonal to the optical axis. The illumination apparatus may further comprise a plurality of illumination modes each of which provides a different condition for illuminating a surface to be illuminated; and a memory for storing an amount of movement of the first optical integrator for each illumination mode, wherein the first optical integrator is moved based upon information stored in the memory when the illumination mode is switched. Alternatively, the illumination apparatus may further comprise a transparent parallel flat plate that light from the first optical integrator enters, wherein light intensity distribution on the second optical integrator is changed by varying a tilt of the parallel flat plate with respect to the optical axis.

According to another aspect of the present invention, there is provided an illumination apparatus comprising: a first optical integrator of an inner surface reflection type; a first condensing system for condensing light from a light source into a light incident part of the first optical integrator; a second optical integrator of an amplitude division type; a second condensing system for superposing a plurality of beams from the second optical integrator on a surface to be illuminated; and an image-forming system for forming an image of a light emission part of the inner surface reflection type optical integrator on the amplitude division type optical integrator, wherein the light emission part of the inner surface reflection type optical integrator is moved in a direction across an optical axis of the second condensing system.

According to another aspect of the present invention, there is provided a projection exposure apparatus comprising: any one of the above-described illumination apparatuses which illuminates a reticle on which a pattern is formed; and a projection optical system for projecting the pattern on a wafer. The projection exposure apparatus may further comprise a detector for detecting telecentricity of the projection optical system, wherein the first optical integrator is moved based upon a detection result by the detector.

According to another aspect of the present invention, there is provided a device fabrication method comprising the steps of: applying a resist onto a wafer; exposing the wafer in accordance with a pattern on a reticle using a projection exposure apparatus according to any one of claims 10 and 11; and developing the wafer that is exposed with the pattern.

Other objects and further features of the present invention will become readily apparent from the following description of the embodiments with reference to accompanying drawings.

DETAILED DESCRIPTION OF THE PREFERRED EMBODIMENTS

Figure 1:
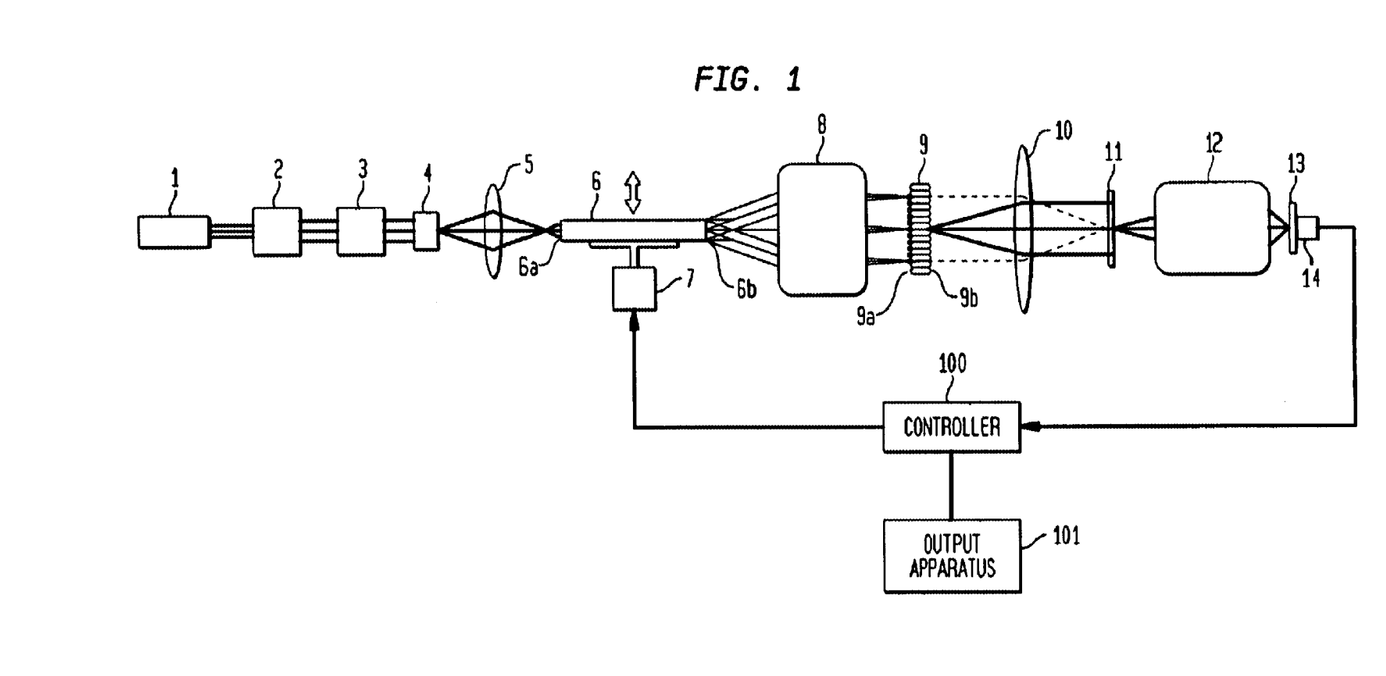
FIG. 1 is a schematic illustration of an essential part of a projection exposure apparatus of an embodiment 1 of the present invention.

FIG. 1 is a schematic illustration of an essential part of a projection exposure apparatus, which is applied to an illumination apparatus of the embodiment 1 of the present invention as an illumination system for illuminating a reticle. The apparatus as illustrated in FIG. 1 shows a step-and-repeat type or step-and-scan type projection exposure apparatus for fabricating semiconductor chips such as LSI and VLSI, CCDs, magnetic sensors, and liquid crystal devices.

In FIG. 1, denoted by 1 is a laser light source such as ArF excimer laser, and KrF excimer laser. Denoted by 2 is a coherence-reducing optical system for making coherent laser beams from the light source 1 incoherent so that a speckle pattern by interference fringes may not be produced on a substrate (or wafer) 13, denoted by 3 is a beam-shaping optical system for forming beams from the coherence-reducing optical system 2 into a desired beam shape, and denoted by 4 is an emission angle retention optical device has an optical action serving to maintain an emission angle even though the beam incident thereon shifts.

Denoted by 5 is a condensing optical system, which condenses the beams from the optical device 4 and leads the beams to the light incident surface 6a of an optical pipe (means for mixing beams). A pipe 6, which assumes a columnar shape having a cross-section of regular triangle, square, or hexagon, creates many virtual light sources while mixing the beams from the condensing optical system 5 through several-time reflections of the incident beams at the side surfaces, and thus achieves uniform illuminance distribution on a light emission surface 6b. This pipe 6 is also called inside reflection type optical integrator.

Denoted by 7 is driving means, which moves the beam mixing means 6 in a direction across an optical axis, and thereby shifts light intensity distribution on the light emission surface 6b in the same direction across the optical axis. This shifts a baricenter of the light intensity distribution on the light incident surface 9a of multi-beam generation means 9 via an image-forming system 8, so that the telecentricity of the beams (or axial image-forming beams) on the substrate 13 may be adjusted.

Denoted by 8 is a zooming optical system (or image-forming optical system), which may project the beams from the pipe 6 onto the light incident surface 9a of the multi-beam generation means 9 under various magnifications. At this time, the light emission surface 6b of the pipe 6 and the light incident surface 9a of the multi-beam generation means 9 have approximately conjugate relationship with each other.

The multi-beam generation means 9 is a fly-eye lens comprised of a lot of element lenses, and the light emission surface 9b is formed with an effective light source consisting of a plurality of secondary light source images. The fly-eye lens includes an aperture stop for determining the dimension and shape of the effective light source. The dimension (σ value) of an opening of the aperture stop and the shape of the opening may be changed to switch the aforementioned illumination modes.

Denoted by 10 is illumination means including a condenser lens and the like, which provides a uniform Kohler illumination on a mask (reticle) 11 by superposing the beams from each element lens on the mask 11. The multi-beam generation means 9 is also called wave front division type optical integrator.

Denoted by 12 is a projection optical system, which is configured as a system of which a light emission side is telecentric, and to reduce and project a pattern on a surface of the reticle 11 onto a surface of a wafer (or substrate) 13. Denoted by 14 is a detector, which detects the baricenter of light quantity distribution of the incident beams, and thereby detects the telecentricity of the beams incident onto the surface of the substrate 13.

Figure 8A:
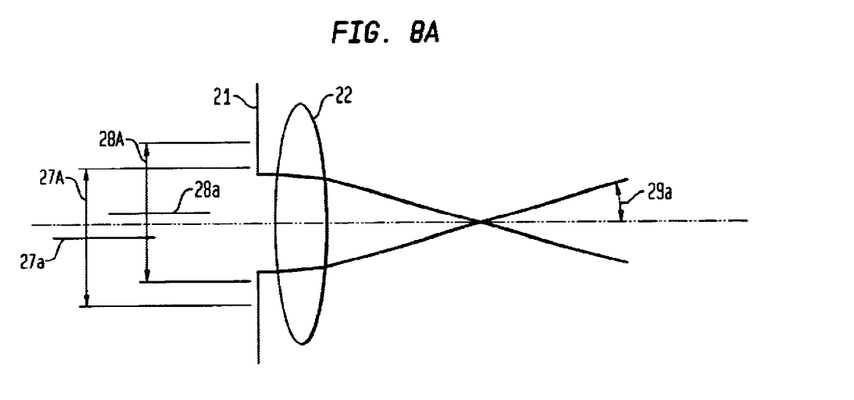
FIG. 8 is an illustration for explaining an emission angle retention optical device 4.

The emission angle retention optical device 4 is comprised, for example as shown in FIG. 8(A), of an aperture 21 and a lens system 22. If the incident beam enters, for example, with an incident direction slightly shifted from a beam 27A (beam center 27*a*) to a beam 28A (beam center 28*a*) in a direction orthogonal to the optical axis, an emission angle 29*a* of the beam emitted from the optical device 4 is kept constant.

Figure 8B:
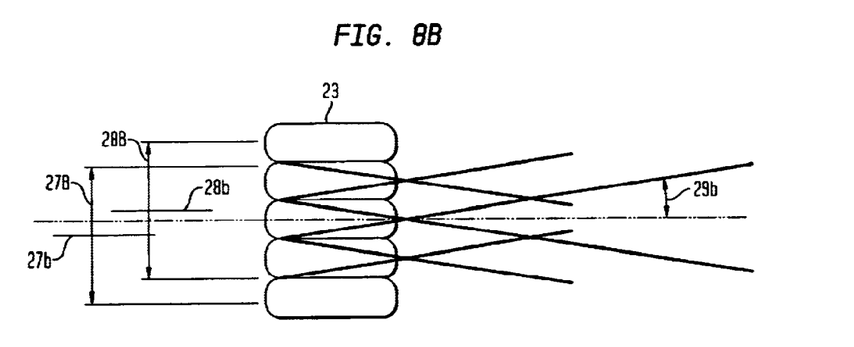

The emission angle retention optical device 4 may be constructed of a fly-eye lens comprised of a plurality of element lenses 23 as shown in FIG. 8(B), and in such cases, the emission angle 29*b* of the beams is determined by the shape of the fly-eye lens 23. As is also the case with this construction, if the incident beam enters, for example, with an incident direction slightly shifted to a beam 27B (beam center 27*b*) or a beam 28B (beam center 28*b*), an emission angle 29*a* of the beam emitted from the optical device 4 is kept constant.

FIG. 2 is an illustration for explaining an operation of telecentricity adjustment according to the embodiment 1 of the present invention.

Figure 2A:
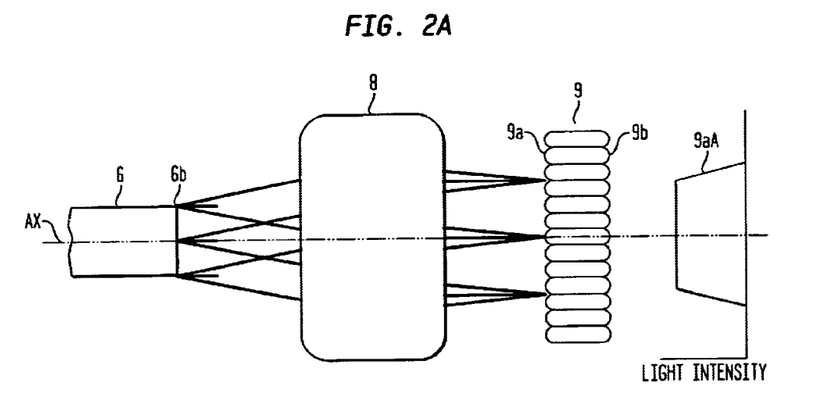
FIG. 2 is an illustration for explaining an operation of telecentricity adjustment according to the embodiment 1 of the present invention.

FIG. 2(A) shows a reference condition, in which the central positions of the optical pipe 6, the zoom optical system 8, and the fly-eye lens 9 are all located on the optical axis AX.

The light intensity distribution on the light incident surface 9*a* of the fly-eye lens 9 in the above condition is indicated by 9*a*A. The light intensity distribution 9*a*A represents such illuminance distribution as symmetrical to the optical axis AX.

Figure 2B:
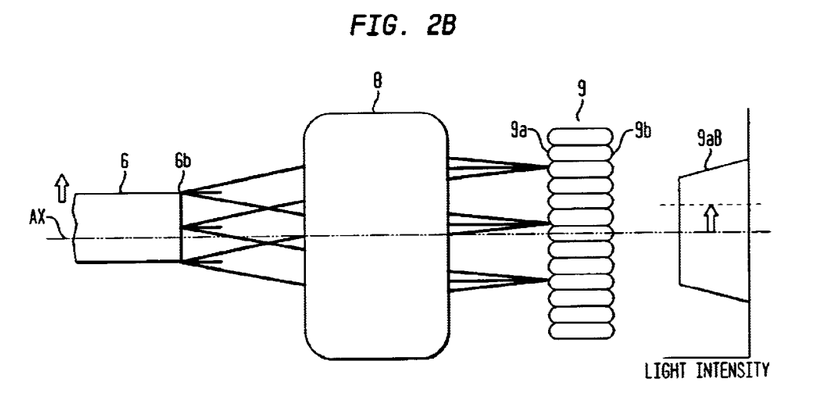

FIG. 2(B) shows a state in which a telecentricity adjustment operation has been carried out, and the optical pipe 6 has been moved from a position in the reference condition toward a direction indicated by an arrow in the drawing. As a result of such movement of the optical pipe 6, the light intensity distribution (an image of the light emission surface 6*b*) on the light incident surface 9*a* of the fly-eye lens 9 changes as indicated by 9*a*B, and consequently, the position of the baricenter of effective light source formed on the light emission surface 9*b* of the fly-eye lens 9 changes, so that the telecentricity on the substrate 13 may be adjusted. Such adjustment may be carried out whenever it appears that the telecentricity has been changed for example when the projection exposure apparatus itself has been manufactured or shipped, the illumination mode has been switched while the projection exposure apparatus operates, or optical components thereof has substantially changed over time.

Figure 3:
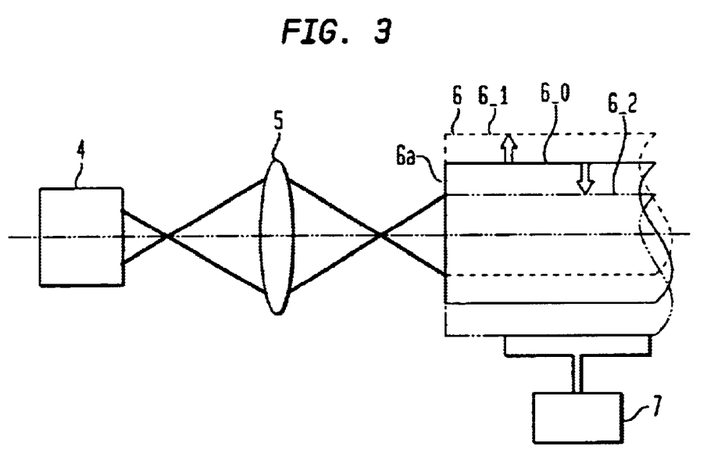
FIG. 3 is a magnified view of a part near a light incident surface 6a of an optical pipe according to the embodiment 1 of the present invention.

FIG. 3 shows an enlarged view of part of the light incident surface 6*a* of the optical pipe 6.

Where an initial position of the optical pipe 6 (in which a center thereof is aligned with the optical axis) is 6_0, and examples of positions to which the center is moved for the purpose of the telecentricity adjustment are 6_1, 6_2, beams which is condensed by the condensing optical system 5 and directed toward the light incident surface 6*a* of the optical pipe 6 is so adjusted as to only illuminate such a range in the light incident surface 6*a* that the beams are prevented from failing to enter and coming out of the optical pipe 6 regardless of the possible largest amount of shift of the optical pipe 6. Accordingly, even if the optical pipe is moved to adjust the telecentricity, the illuminance never decreases.

The above telecentricity adjustment may be carried out by inputting the result of the detector 14 as shown in FIG. 1, into a controller 100, determining a driving amount necessary for the controller 100 to realize a telecentric condition, and feeding back an signal indicating the amount to the driving means 7 so as to automatically realize a desired preferable condition, or by outputting the result of the detector 14 by an output device 101 such as a display and printer, and allowing an operator to make a manual adjustment based upon the output information. Like adjustment may be performed in other embodiments that will be described below.

Further, an optimal position (adjustment position) for each illumination mode may be stored in advance in a memory means (not shown), so that an optical pipe 6 may be driven based upon the stored position information when the illumination mode is switched.

Alternatively, the above operation of determining and storing an optimal adjustment position for each illumination mode may be performed after a certain period of time, which had been predetermined, has passed, and when the apparatus does not expose the substrate.

Next, the embodiment 2 of the present invention will be described.

Figure 4:
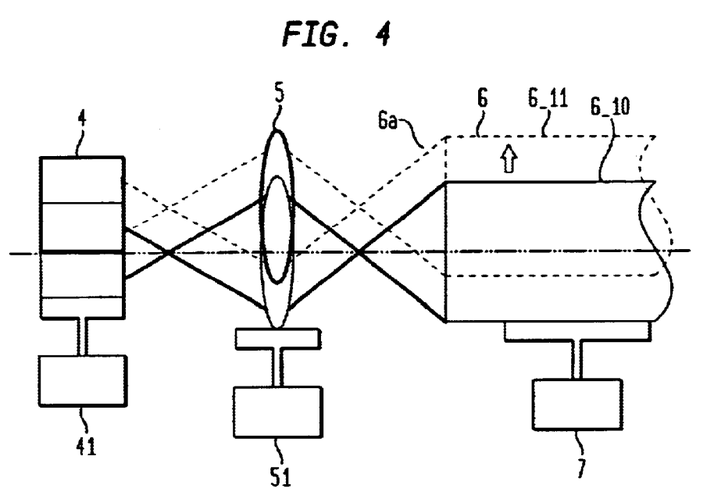
FIG. 4 is a magnified view of a part near a light incident surface 6a of an optical pipe according to an embodiment 2 of the present invention.

FIG. 4 is, as well as FIG. 3., an enlarged view of part near the light incident surface 6*a* of the optical pipe 6. Since dissimilarities of the embodiment 2 from the embodiment 1 lie only within the range illustrated in the drawing and the other essential components are of like construction and features, an explanation will be omitted. In FIG. 4, Denoted by 41 is driving means of the optical device 4, and denoted by 51 is driving means of the condensing optical system 5.

The feature of the optical pipe 6 as an inner surface reflection type optical integrator is that the degree of uniformity of illuminance distribution at an emission end thereof is roughly proportional to the number of reflections in the optical pipe 6. Assuming that a divergence or convergence angle of beams incident into the optical pipe 6 is kept constant, the smaller (or thinner) the light incident surface (i.e., optical pipe diameter) is, the higher the count of reflections rises, while the longer the total length of the optical pipe 6 is, the higher the count of reflections rises, too.

However, the total length of the optical pipe 6 is not unlimited because of the dimensions of the apparatus, the limited length of obtainable glass material, the risk of lowered transmittance, and the like, and an attempt is thus made to increase the number of reflections, once a practical length is determined, by reducing the diameter of the optical pipe 6. Accordingly, the diameter is likely to become smaller.

In the embodiment 1, the incident light is condensed within a range smaller than the light incident surface 6*a* of the optical pipe 6 in order to avoid a loss of light accompanied by the movement of the optical pipe 6, but if the light incident surface 6*a* of the optical pipe 6 is small, the light is condensed into smaller range than the surface 6*a*, and the light intensity on the light incident surface becomes higher, whereby the possibility of deteriorating the glass material and lowering transmittance thereof arises.

Therefore, in the instant embodiment, in order to eliminate the above possibility, the optical device 4 and the condensing optical system 5 is also moved in synchronization with the movement of the optical pipe 6, and the incident light is illuminated onto as broad an area as possible of the light incident surface 6*a* of the optical pipe 6, so that the light intensity on the light incident surface 6*a* may be decreased to prevent the glass material from deteriorating.

It is understood that the optical device 4, the condensing optical system 5, and the optical pipe 7 may be coupled and driven in combination, though they each have separate driving means in FIG. 4.

Next, the embodiment 3 of the present invention will be described.

Figure 5:
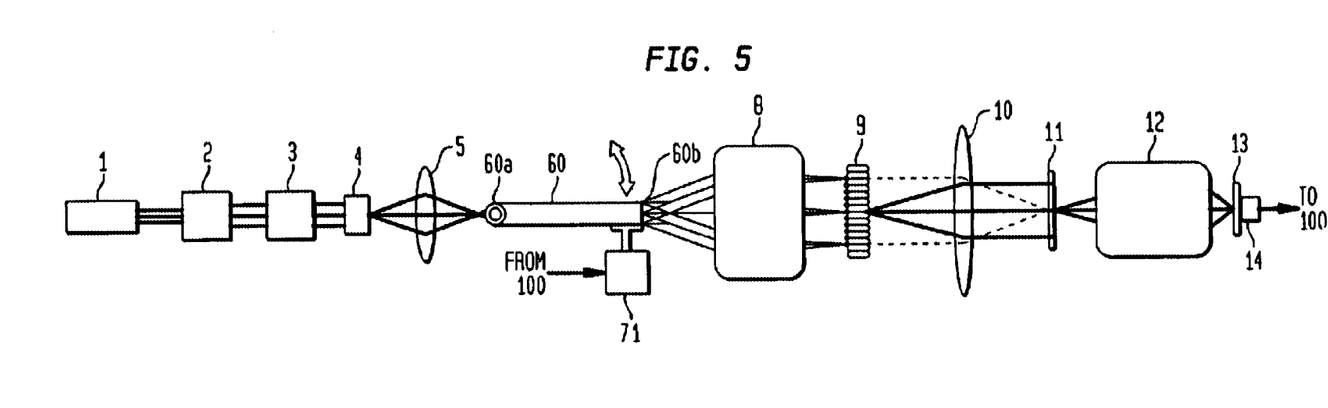
FIG. 5 is a schematic illustration of an essential part of a projection exposure apparatus of an embodiment 3 of the present invention.

FIG. 5 is a schematic view of an essential part of the projection exposure apparatus of the present embodiment, and dissimilarities thereof from the embodiment 1 lie in the optical pipe (beam mixing means) 60 pivotable about a pivotal point near a light incident surface 60a at a slight angle by driving means 71. This mechanism allows the light emission surface 60b of the optical pipe 60 to shift in a direction orthogonal to the optical axis substantially in the same manner as being moved in a plane orthogonal to the optical axis, and the light intensity distribution (an image of the light emission surface 6b) on the light incident surface 9a of the fly-eye lens is moved in a direction orthogonal to the optical axis as described above with reference to the embodiment 1, so that the telecentricity on the substrate 13 may be adjusted.

Generally, the optical pipe has an extremely long length relative to a diameter thereof in order to enhance uniformity of illuminance distribution of the light emission part. Therefore, the amount of pivoting motion of the optical pipe required to adjust the telecentricity is so small that a change in the divergence or convergence angle of beams between those incident into and those emitted from the optical pipe may be negligibly small, even if the optical pipe is pivoted.

In the present embodiment 3, the light incident surface 60a of the optical pipe 60 is little moved with respect to the optical axis, and thus the condensing degree of the beams from the condensing optical system 5 may be reduced, so that the optical pipe may be prevented from deteriorating.

Next, the embodiment 4 of the present invention will be described.

Figure 6:
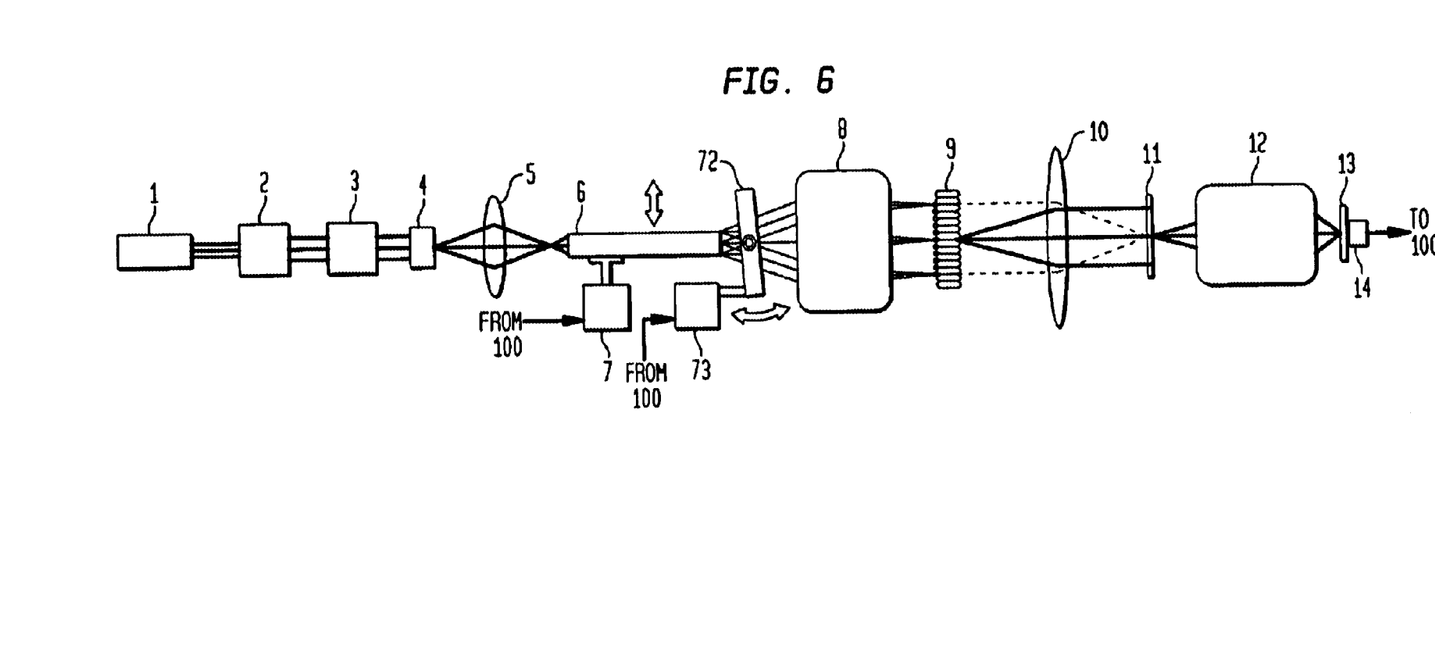
FIG. 6 is a schematic illustration of an essential part of a projection exposure apparatus of an embodiment 4 of the present invention.

FIG. 6 is a schematic view of an essential part of the projection exposure apparatus of the present embodiment 4, and dissimilarities thereof from the embodiment 1 lie in second adjustment means 72 provided between the optical pipe 9 and the zoom optical system 8.

FIG. 7 is an enlarged view of a part near the second adjustment means 72. The second adjustment means 72 is, for example, made of a transparent parallel flat plate, and so constructed as to be tilted by driving means 73 with respect to the optical axis of the illumination system.

Figure 7A:
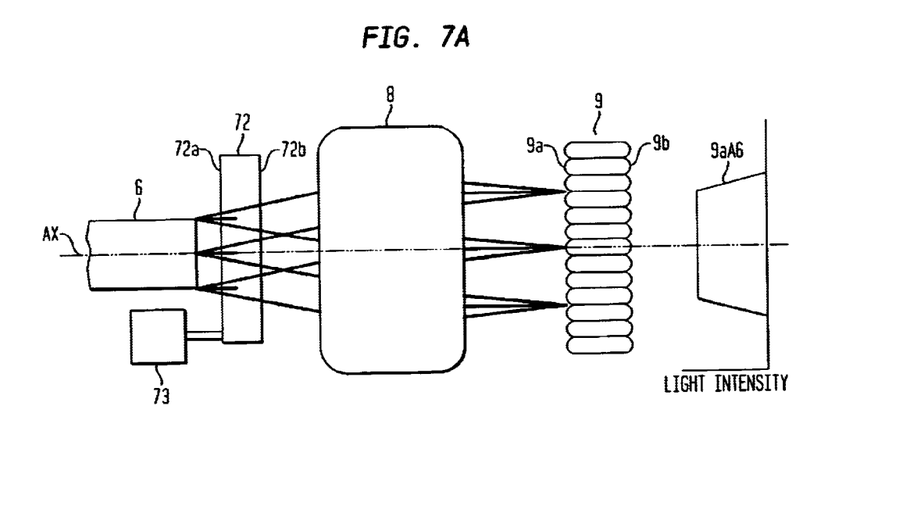
FIG. 7 is an illustration for explaining an operation of a second adjustment means according to the embodiment 4 of the present invention.

FIG. 7(A) shows a reference condition, in which the optical pipe (beam mixing means) 6, the zoom optical system (image-forming system) 8, and the fly-eye lens (multi-beam generation means) 9 are so disposed that light centers thereof are all aligned on a line coincident with the optical axis AX, and a light incident surface 72a and a light emission surface 72b are orthogonal to the optical axis.

In the above condition, the light intensity distribution 9aA6 on the light incident surface 9a of the fly-eye lens 9 is illuminance distribution symmetrical to the optical axis.

Figure 7B:
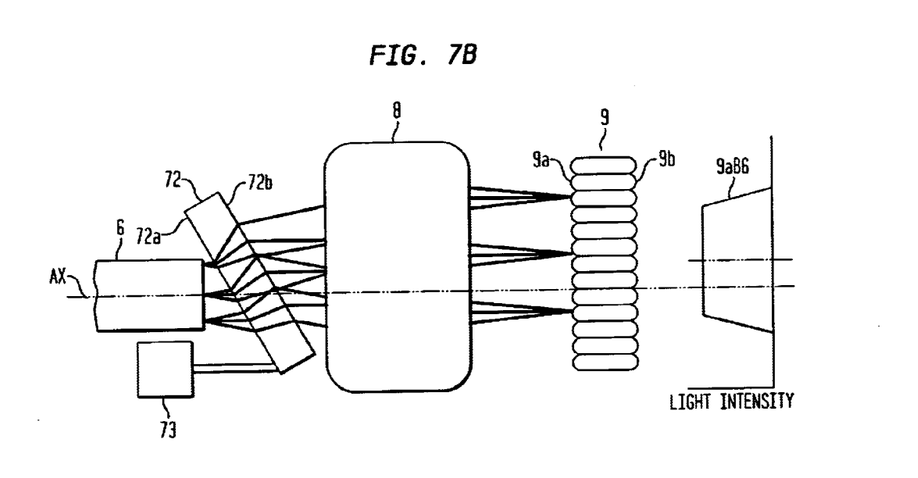

On the contrary, FIG. 7(B) shows a condition in which a position of the optical pipe 6 is kept in the reference position, and only the second adjustment means 72 is driven. The second adjustment means 72 allows the beams from the optical pipe 6 to move in parallel in a plane orthogonal to the optical axis, and the beams travels through the zoom optical system 8 and forms an image on the light incident surface 9a of the fly-eye lens 9. Consequently, the light intensity distribution 9aB6 on the light incident surface 9a of the fly-eye lens 9 becomes the same distribution as the light intensity distribution 9aA6 moved in a direction orthogonal to the optical axis, so that the telecentricity on the substrate 13 may be adjusted.

According to the system utilizing two means for adjusting telecentricity, for example, even if the optical pipe 6 is too large and heavy to be properly be driven for each illumination mode, an adjustment of telecentricity by movement of the optical pipe 6 may be made to strike a balance among respective illumination modes, while a fine adjustment for each illumination mode may be made by the second adjustment means 72, so that the telecentricity may be adjusted for each illumination mode.

Moreover, if an adjustment of telecentricity by movement of the optical pipe 6 is made only during manufacturing in the factory, while a subsequent automatic adjustment of telecentricity is made by the second adjustment means 72, then the driving means 7 of the optical pipe 6 may be omitted.

Further, the second adjustment means 72 may be made in almost the same size as the diameter of the optical pipe 6, and thus the driving means or the like may be designed simply.

In addition, the movement of the optical pipe 6 is sensitive to telecentricity, but if the second adjustment means 72 is realized as that which varies a tilt of a parallel flat plate, the sensitivity may be made relatively low.

FIG. 6 shows the optical pipe 6 which is moved in parallel on a plane orthogonal to the optical axis, but the same mechanism as in the embodiment 3 is applicable in which the optical pipe may be pivoted about an axis orthogonal to the optical axis in the light incident part thereof.

The adjustment of telecentricity by the second adjustment means 72 may be made by automatically creating a desired preferable condition based upon the output of the detector 14, or by allowing an operator to make a manual adjustment based upon the output of the detector 14.

Further, an optimal position (adjustment position) for each illumination mode may be stored in advance, so that the optical pipe 6 or the second adjustment means 72 may be driven based upon the stored position information when the illumination mode is switched.

Alternatively, the above operation of determining and storing an adjustment position for each illumination mode may be performed after a certain period of time, which had been predetermined, has passed, and when the apparatus does not expose the substrate.

Next, a description will be given of an embodiment of a semiconductor device fabricating method using various exposure apparatuses as described above.

Figure 9:
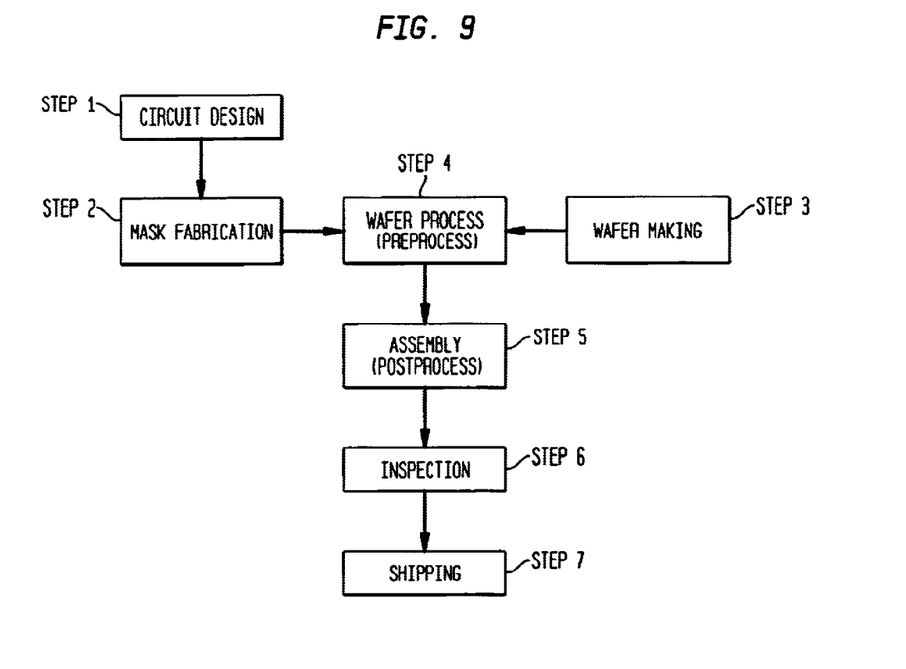
FIG. 9 is a flowchart for explaining a semiconductor device fabrication.

FIG. 9 is a flowchart for explaining a fabrication process of semiconductor devices (e.g., semiconductor chips such as IC and LSI, or liquid crystal panels, CCDs, or the like). In step 1 (Circuit design), a semiconductor device circuit is designed. In step 2 (Mask fabrication), a designed circuit pattern is formed into a mask. On the other hand, in step 3 (Wafer making), a wafer is made using materials such as silicon. In step 4 (Wafer process), which is called preprocess, the mask and wafer as prepared in the above steps are used to form actual circuitry on the wafer using the lithography technique. The subsequent step 5 (Assembly), which is called postprocess, in which the wafer processed in step 4 is used to create a semiconductor chip, includes the steps of assembly (dicing, bonding), packaging (chip sealing), and the like. In step 6 (Inspection), inspections such as an operation check of the semiconductor device assembled in step 5, a durability check, and the like are conducted. A semiconductor device is finished through these steps, and shipped (in step 7).

Figure 10:
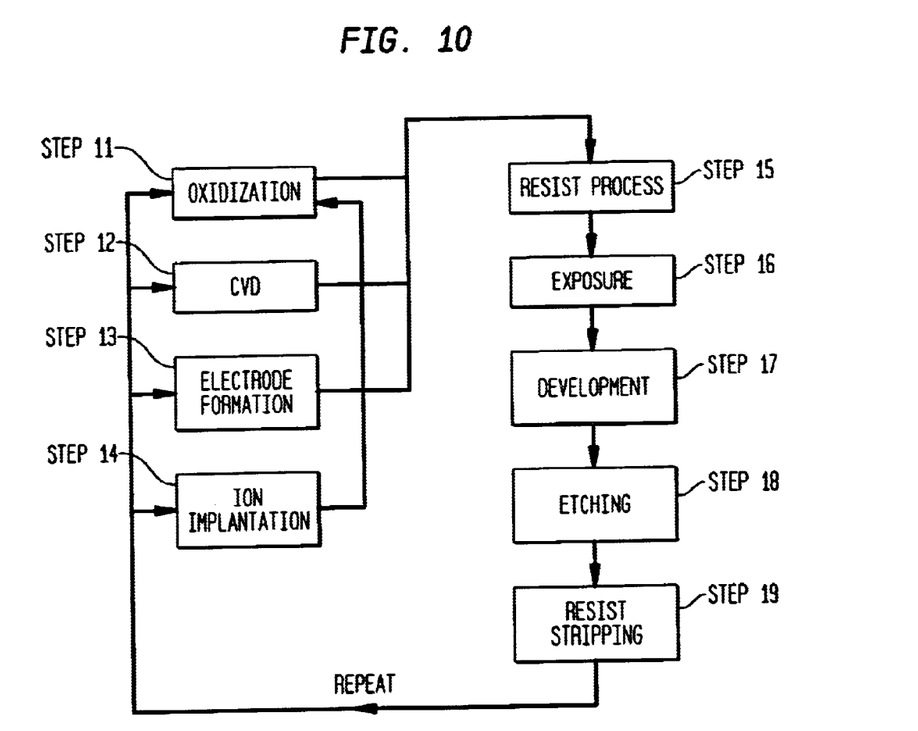
FIG. 10 is a flowchart for explaining a wafer process in FIG. 9.

FIG. 10 is a detailed flowchart of the wafer process in step 4 in FIG. 10. In step 11 (Oxidization), a surface of the wafer is oxidized. In step 12 (CVD), an insulating film is formed on the surface of the wafer. In step 13 (Electrode formation), electrodes are formed by vapor deposition or the like. In step 14 (Ion implantation), ions are implanted into the wafer. In step 15 (Resist process), a photosensitive material is coated to the wafer. In step 16 (Exposure), a circuit pattern on the mask is formed on the wafer by exposure. In step 17 (Development), the exposed wafer is developed. In step 18 (Etching), part other than a developed resist image is etched. In step 19 (Resist stripping), the resist disused after etching is removed. These steps are repeatedly followed, and thus overlaid circuit patterns are formed on the wafer.

The use of the fabrication method of the instant embodiments enables the fabrication of high-precision semiconductor devices that was conventionally impossible.

According to each of the embodiments as described above, a shift of telecentricity on the substrate may be properly adjusted without lowering the efficiency of the illuminating light impinging on the surface to be illuminated.

Although the preferred embodiments of the present invention have been described above, various modifications and changes may be made in the present invention without departing from the spirit and scope thereof.

What is claimed is:

1. An illumination apparatus, comprising:
    a fist optical system for forming a uniform light intensity distribution,
    a second optical system including an optical integrator and a condensing system, for superposing a plurality of beams from the optical integrator on a surface to be illuminated;
    a projection system for projecting the uniform light intensity distribution onto the optical integrator of said second optical system; and
    a device for changing position of the uniform light intensity distribution in a direction across an optical axis of the projection system relative to an incident surface on said second optical system.

2. An illumination apparatus, comprising:
    a first optical integrator of an inner surface reflection type;
    a first condensing system for condensing light from a light source into a light incident part of the first optical integrator;
    a second optical integrator of a wavefront division type;
    a second condensing system for superposing a plurality of beams from the second optical integrator on a surface to be illuminated;
    an image forming system for forming an image of a light emission part of the inner surface reflection type optical integrator on the wavefront division type optical integrator; and
    a device for moving the light emission part of the inner surface reflection type optical integrator in a direction across an optical axis of the second condensing system.

3. An illumination apparatus according to claim 2, wherein the device moves the light emission part in a direction orthogonal to the optical axis.

4. An illumination apparatus according to claim 3, wherein the device moves the first optical integrator in the orthogonal direction within such a range that creates no loss of light incident onto the first optical integrator.

5. An illumination apparatus according to claim 4, moving at least part of optical elements in the first condensing system in the direction orthogonal to the optical axis in synchronization with movement of the first optical integrator.

6. An illumination apparatus according to claim 2, wherein the device pivots the first optical integrator about an axis orthogonal to the optical axis.

7. An illumination apparatus according to claim 2, further comprising a transparent parallel flat plate that light from the first optical integrator enters,
    wherein light intensity distribution on the second optical integrator is changed by varying a tilt of the parallel flat plate with respect to the optical axis.

8. An illumination apparatus according to claim 2, further comprising:
    a plurality of illumination modes each of which provides a different condition for illuminating a surface to be illuminated; and
    a memory for storing an amount of movement of the first optical integrator for each illumination mode, wherein the first optical integrator is moved based upon information stored in the memory when the illumination mode is switched.

9. An illumination apparatus according to claim 3, further comprising:
    a plurality of illumination modes each of which provides a different condition for illuminating a surface to be illuminated; and
    a memory for storing an amount of movement of the first optical integrator for each illumination mode, wherein the first optical integrator is moved based upon information stored in the memory when the illumination mode is switched.

10. An illumination apparatus according to claim 4, further comprising:
    a plurality of illumination modes each of which provides a different condition for illuminating a surface to be illuminated; and
    a memory for storing an amount of movement of the first optical integrator for each illumination mode, wherein the first optical integrator is moved based upon information stored in the memory when the illumination mode is switched.

11. An illumination apparatus according to claim 5, further comprising:
    a plurality of illumination modes each of which provides a different condition for illuminating a surface to be illuminated; and
    a memory for storing an amount of movement of the first optical integrator for each illumination mode, wherein the first optical integrator is moved based upon information stored in the memory when the illumination mode is switched.

12. An illumination apparatus according to claim 6, further comprising:
    a plurality of illumination modes each of which provides a different condition for illuminating a surface to be illuminated; and
    a memory for storing an amount of movement of the first optical integrator for each illumination mode, wherein the first optical integrator is moved based upon information stored in the memory when the illumination mode is switched.

13. An illumination apparatus comprising:

a first optical integrator of an inner surface reflection type;

a first condensing system for condensing light from a light source into a light incident part of the first optical integrator;

a second optical integrator of an wavefront division type;

a second condensing system for superposing a plurality of beam from the second optical integrator on a surface to be illuminated;

an image forming system for forming an image of a light emission part of the inner surface reflection type optical integrator on the wavefront division the optical integrator, and wherein the light emission part of the inner surface reflection type optical integrator is moved in a direction across an optical axis of the second condensing system.

14. A projection exposure apparatus comprising;

an illumination apparatus which illuminates a reticle on which a pattern is formed; and a projection optical system for projecting the pattern on a wafer, wherein the illumination apparatus includes:

a first optical integrator of an inner surface reflection type;

a first condensing system for condensing light from a light source into a light incident part of the first optical integrator:

a second optical integrator of an wavefront division type;

a second condensing system for superposing plurality of beams from the second optical integrator on a surface to be illuminated;

an image forming system for forming an image of a light emission pair of the inner surface reflection type optical integrator on the wavefront division type optical integrator; and a device for moving the light emission part of the inner surface reflection type optical integrator in a direction across an optical axis of the second condensing system.

15. A projection exposure apparatus according to claim 14, further comprising a detector for detecting telecentricity of the projection optical system, wherein the first optical integrator is moved based upon a detection result by the detector.

16. A device fabrication method comprising the steps of:

applying a resist onto a wafer;

exposing the wafer in accordance with a pattern on a reticle using a projection exposure apparatus according to claim 14; and developing the wafer that is exposed with the pattern.

17. A projection apparatus comprising:

an illumination apparatus which illuminates a reticle on which a pattern is formed; and a projection optical system for projecting the pattern on a wafer;

wherein the illumination apparatus includes:

a first optical system for forming a uniform light intensity distribution;

a second optical system including an optical integrator and a condensing system, for superposing a plurality of beams from the optical integrator on a surface to be illuminated;

a projection system for projecting the uniform light intensity distribution onto the optical integrator of said second optical system; and a device for changing a position of the uniform light intensity distribution in a direction across an optical axis of the projection system relative to said second optical system.

18. A projection exposure apparatus according to claim 17, further comprising a detector for detecting telecentricity of the projection optical system;

wherein the first optical system is moved based upon a detection result by the detector.

19. A device fabrication method comprising the steps of:

applying a resist onto a wafer;

exposing the wafer in accordance with a pattern on a reticle using a projection exposure apparatus according to claim 17; and developing the wafer that is exposed with the pattern.

20. A projection exposure apparatus comprising:

an illumination apparatus which illuminates a reticle on which a pattern is formed, and a projection optical system for projecting the pattern on a wafer;

wherein the illumination apparatus includes:

a first optical integrator of an inner surface reflection type;

a first condensing system for condensing light from a light source into a light incident part of the first optical integrator;

a second optical integrator of an wavefront division type;

a second condensing system for superposing a plurality of beams from the second optical integrator on a surface to be illuminated; and an image forming system for forming an image of a light emission part of the inner surface reflection type optical integrator on the wavefront division type optical integrator, wherein the light emission part of the inner surface reflection type optical integrator is moved in a direction across an optical axis of the second condensing system.

21. A projection exposure apparatus according to claim 20, further comprising a detector for detecting telecentricity of the projection optical system, wherein the first optical integrator is moved based upon a detection result by the detector.

22. A device fabrication method comprising the steps of:

applying a resist onto a wafer, exposing the wafer in accordance with a pattern on a reticle using a projection exposure apparatus according to claim 20; and developing the wafer that is exposed with the pattern.

* * * * *

UNITED STATES PATENT AND TRADEMARK OFFICE
CERTIFICATE OF CORRECTION

PATENT NO. : 6,614,597 B2
DATED : September 2, 2003
INVENTOR(S) : Satoru Mizouchi It is certified that error appears in the above-identified patent and that said Letters Patent is hereby corrected as shown below:

Column 1,
Line 35, "value 6 represented" should read -- value σ represented --

Column 11,
Line 32, "superposing plurality" should read -- superposing a plurality --
Line 36, "emission pair of" should read -- emission part of --

Signed and Sealed this

Thirteenth Day of January, 2004

JON W. DUDAS
*Acting Director of the United States Patent and Trademark Office*